United States Patent
Zhou et al.

(10) Patent No.: US 6,967,508 B2
(45) Date of Patent: Nov. 22, 2005

(54) COMPACT FREQUENCY DOUBLER/MULTIPLIER CIRCUITRY

(75) Inventors: Jian Zhou, Plano, TX (US); Jun Chen, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/794,833

(22) Filed: Mar. 4, 2004

(65) Prior Publication Data
US 2005/0194999 A1    Sep. 8, 2005

(51) Int. Cl.[7] ............................................. H03K 23/54
(52) U.S. Cl. ..................... 327/122; 327/116
(58) Field of Search ........................ 327/117, 113, 116, 327/119, 122

(56) References Cited

U.S. PATENT DOCUMENTS

| | | | | |
|---|---|---|---|---|
| 6,154,076 A | * | 11/2000 | Hastings | 327/175 |
| 6,348,821 B1 | * | 2/2002 | Schwartz | 327/122 |
| 6,369,622 B1 | * | 4/2002 | Lim et al. | 327/116 |
| 6,747,489 B2 | * | 6/2004 | Nasu | 327/116 |

* cited by examiner

*Primary Examiner*—Dinh T. Le
(74) *Attorney, Agent, or Firm*—Alan K. Stewart; W. James Brady, III; Frederick J. Telecky, Jr.

(57) ABSTRACT

The frequency doubling circuit and method provides an output signal with stable frequency and a 50% duty cycle. The frequency of the output signal is two times a frequency of the input signal. The circuit only requires four comparators, eight small capacitors, and some switches and transistors for frequency doubling applications. With the help of feedforward structure, the circuit has an almost-instantaneous response. The performance of the provided frequency doubling circuit and method is independent of the frequency and duty cycle of input signal, power supply voltage, temperature, and process variations.

13 Claims, 2 Drawing Sheets

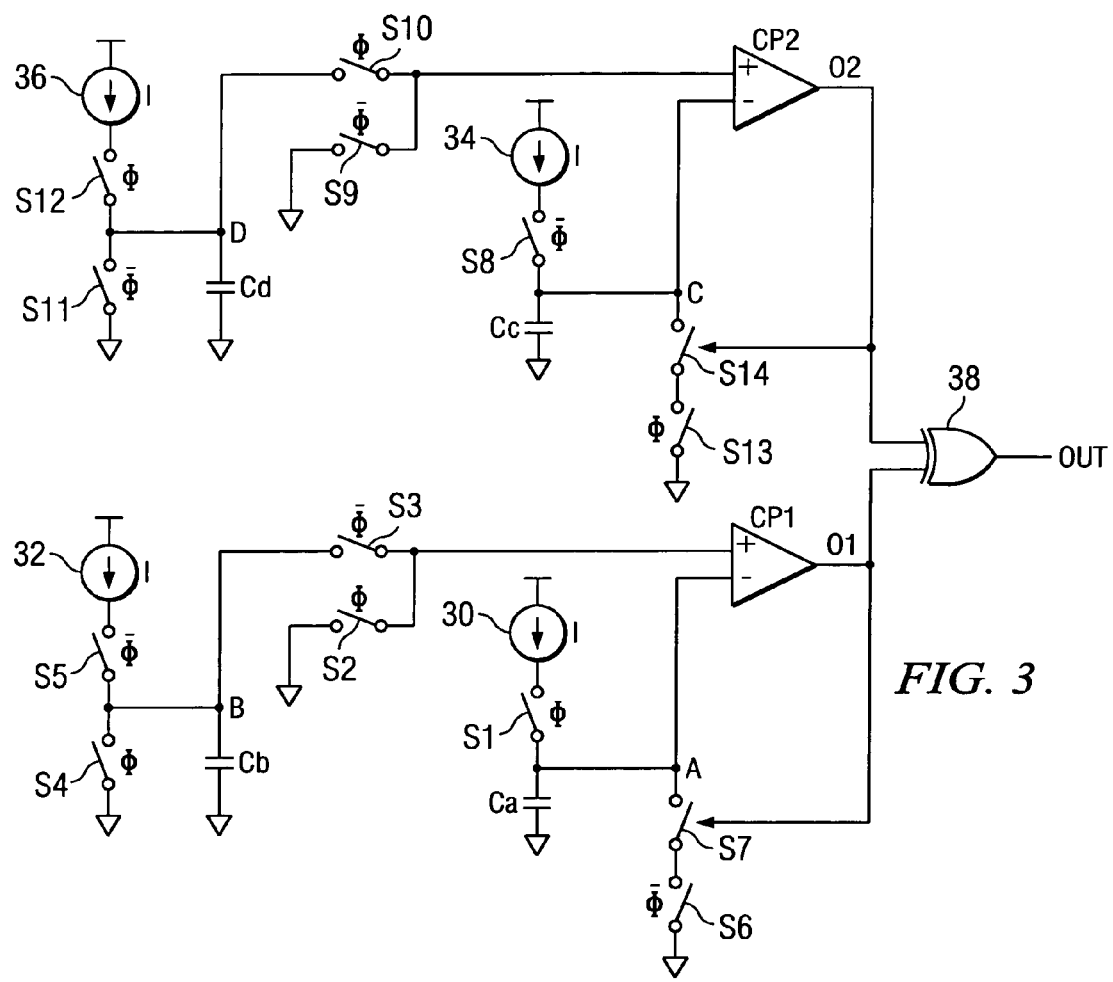
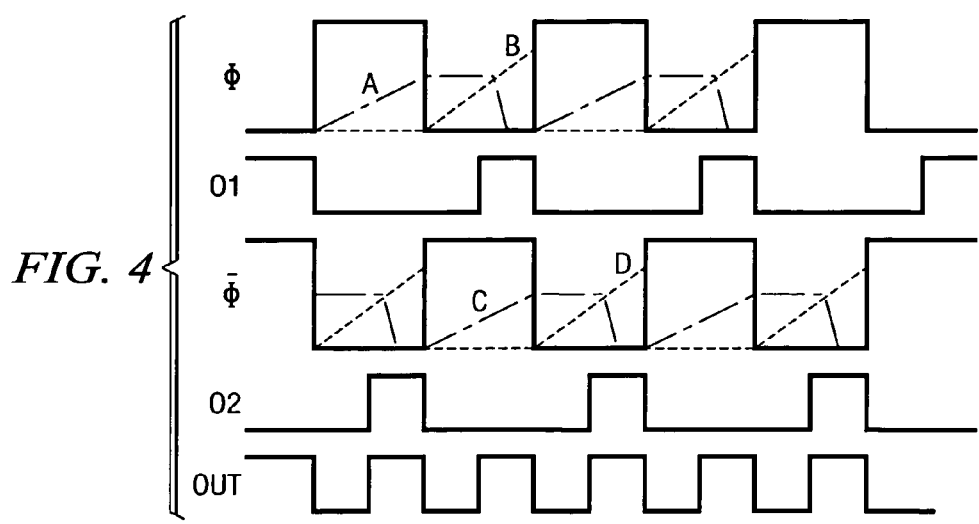
*FIG. 3*
*FIG. 4*

COMPACT FREQUENCY DOUBLER/MULTIPLIER CIRCUITRY

FIELD OF THE INVENTION

The present invention relates to electronic circuitry and, in particular, to a frequency multiplier device.

BACKGROUND OF THE INVENTION

The most common prior art frequency doubler is shown in FIG. 1A. In the circuit shown in FIG. 1A, the input signal In is delayed through delay device 20, and then the delayed signal XORs with the original input signal at XOR gate 22. The circuit in FIG. 1A is essentially an edge detector. FIG. 1B shows a plot the input signal In, delayed signal InD, and output signal Out for the circuit of FIG. 1A. The problem of this circuit is that it requires a 50% duty cycle of the input signal. If the input signal does not have 50% duty cycle, the output frequency will not be stable as shown in FIG. 1B. The other problem is that the duty cycle of the output signal varies with input signal frequency, temperature, process and other variables due to the fixed RC delay element.

The output of the XOR gate in FIG. 1 is fed to a RC low pass filter. The DC component of the low pass filter is compared to a reference voltage V, usually a half value of power supply voltage, for 50% duty cycle. The feedback circuitry 24 shown in the prior art circuit of FIG. 2A solves the fixed delay problem of the prior art circuit in FIG. 1A. A plot of the input signal In, input delay signal InD, and output signal Out for the circuit of FIG. 2A is shown in FIG. 2B. However, this circuit still exhibits two main problems. First, it employs a low pass filter consisting of a large resistor R and capacitor C to have lower conner frequency. Because of the RC time constant, the response time of the circuit of FIG. 2A is also very long. The second problem is the same as in the prior art circuit of FIG. 1A. It still requires a 50% duty cycle of the input signal In, otherwise the output frequency will not be stable.

In another prior art circuit, the frequency doubler circuit receives four input signals in quadrature and combines them to produce a pair of antiphase signals at twice the input frequency. The circuit requires four quadrature inputs which are usually not available.

Another prior art circuit receives an input signal having a first frequency which is input to a phase shifting circuit element to provide an intermediate signal resembling the input signal except shifted in phase. The intermediate signal is provided to a logic element which combines the intermediate frequency with the input signal to produce an output signal having a second frequency which is double the first frequency. The drawback is that it requires the input signal have exactly 50% duty cycle, otherwise it will not only have the same issue as described above, but also the integrator in the circuit will saturate and make the doubler fail.

BRIEF DESCRIPTION OF THE DRAWINGS

In the drawings:

FIG. 3 is a preferred embodiment frequency doubling circuit;

FIG. 4 is a waveform diagram for the circuit of FIG. 3;

DETAILED DESCRIPTION OF PREFERRED EMBODIMENTS

Figure 1A:
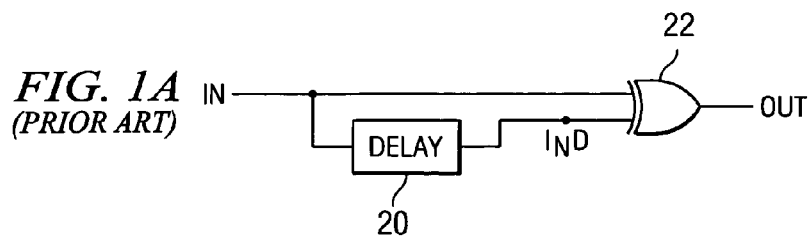
FIG. 1A is a prior art frequency doubler circuit.
Figure 1B:
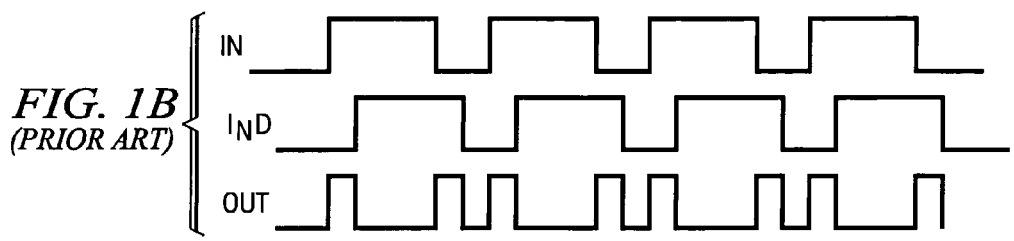
FIG. 1B is a plot of the input and output signals for the circuit of FIG. 1A.
Figure 2A:
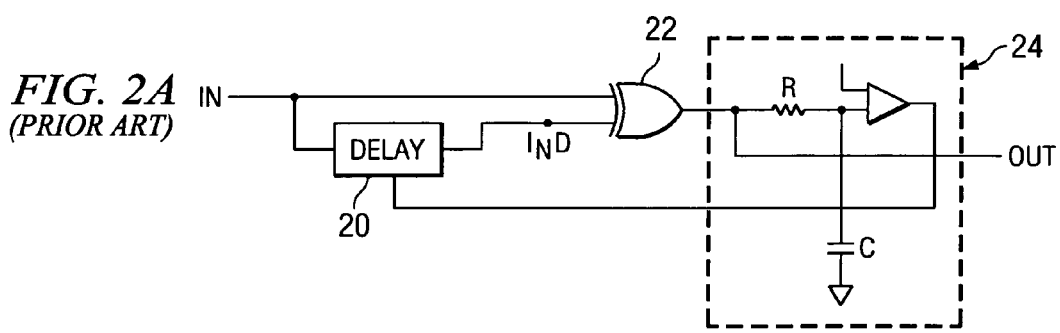
FIG. 2A is a prior art frequency doubler circuit.
Figure 2B:
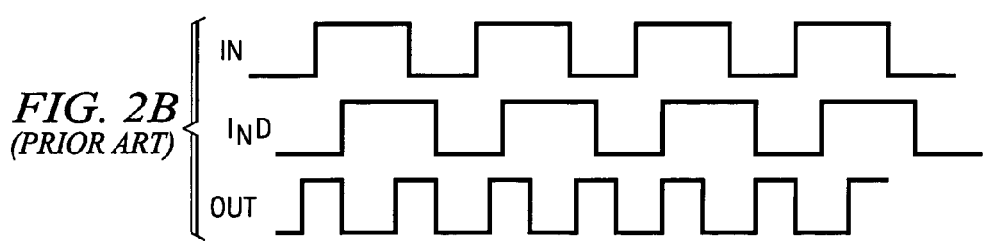
FIG. 2B is a plot of the input and output signals for the circuit of FIG. 2A.

A frequency doubling circuit and method is presented according to the present invention. With the help of using feedforward structure instead of feedback structure, the preferred embodiment circuit has an almost-instantaneous response time. Different from the prior art frequency doubling circuits, the preferred embodiment circuit provides an output signal with a stable frequency and a 50% duty cycle without relying on a 50% duty cycle of the input signal and without using large resistors and capacitors for delay and low-pass filtering. The performance of the preferred embodiment circuit is based on capacitor and current source matching, thus, it is independent of the frequency and duty cycle of input signal, power supply voltage, temperature, and process variations. The preferred embodiment circuit only requires four comparators, eight small capacitors, and some switches and transistors for frequency doubling applications. The method and circuitry of the present invention can be extended to frequency multiplication applications.

The preferred embodiment frequency doubling circuit, shown in FIG. 3, includes two comparators CP1 and CP2; four capacitors Ca, Cb, Cc, Cd; switches S1–S14; current sources 30, 32, 34, and 36; XOR gate 38; and output Out. The capacitor values in the preferred embodiment are selected as follows:

$$Ca=Cc=C, \text{ and } Cb=Cd=0.5C$$

where C can be any small capacitance, for example C=2 pF.

The capacitor voltages are denoted as A, B, C, D for the four capacitors Ca, Cb, Cc, and Cd respectively, as shown in FIG. 3. Switches S1–S14 are required in the frequency doubler circuit for the control of charging and discharging the four capacitors. The current to charge the capacitors are denoted as I. The control signals $\Phi$ and $\overline{\Phi}$ control the switches S1–S6 and S8–S13. Actually, control signal $\Phi$ is the input signal whose frequency is requested to be doubled.

First of all, assume the input signal $\Phi$ and its complementary signal $\overline{\Phi}$ have stable frequency and 50% duty cycle. Their waveforms are illustrated in FIG. 4. The case that the input signal does not have 50% duty cycle will be explained after the description of the frequency doubler shown in FIG. 3.

When the input signal $\Phi$ becomes high at the beginning of the first half cycle (t=O), the capacitor Ca starts to be charged by the current source I, and capacitor voltage A is increasing with the time. At the end of the first cycle of $\Phi$, (t=$T_s$/2) the charging current I of Ca is turned off, and charging is stopped. The capacitor voltage A will be held at the value of $I*T_s/2C$ for the next half cycle (t is from $T_s/2$ to $T_s$), as shown in FIG. 4. During the first half cycle of $\Phi$, (t is from 0 to $T_s/2$), the capacitor Cb is held low by a switch. The output voltage of the comparator CP1, O1, is kept low because of the plus pin of comparator CP1 is grounded by switch S2 while the minus pin voltage is increasing. At the beginning of the second half cycle of $\Phi$ (t=$T_s/2$), the capacitor Cb starts to be charged by the current source 32, and capacitor voltage B is increasing with time, as shown in FIG. 4. It is noted that capacitor Cb is only half the capacitance of capacitor Ca. For the same charging current I, capacitor Cb is charging twice as fast as capacitor Ca. At the time of $T_s \cdot \frac{3}{4}$, capacitor voltage B equals capacitor voltage A. At this moment ($t=T_s \cdot \frac{3}{4}$), comparator CP1's voltage O1 becomes high, and capacitor Ca is discharged by switches S6 and S7. For the rest of the cycle ($t=T_s \cdot \frac{3}{4}$ to $t=T_s$), the comparator voltage O1 will be kept high because the plus pin voltage is higher than the minus pin voltage of comparator CP1. At the beginning of the next cycle ($t=T_s$), capacitor Cb is discharged and voltage B becomes low again. The comparator voltage O1 goes to low because the minus pin of comparator CP1 is charged high at the beginning of the next cycle. In this implementation, as can be seen in FIG. 3, at the end of the cycle (t=Ts) the plus pin is switched directly to ground rather than connected to signal B. By doing that, the discharge time of capacitor Cb can also be eliminated. The waveform of comparator voltage O1 is presented in FIG. 4. The operations of capacitors Cc, Cd, and comparator CP2 are similar to Ca, Cb, and CP1, but capacitor Cc is charged when $\overline{\Phi}$ becomes high. Therefore, the waveforms of capacitor voltages C and D, and comparator voltage O2 will be the half-cycle-shifted versions of capacitor voltages A and B, and comparator voltage O1 respectively, as shown in FIG. 4.

As shown in FIG. 4, the outputs of comparators CP1 and CP2, O1 and O2, have the same frequency as the original signal $\Phi$, and they have 25% duty cycle. By comparing the two outputs O1 and O2, the two outputs have a half cycle phase shift. After XORing O1 with O2, a signal Out is obtained that is double the frequency of the input signal $\Phi$ and it has 50% duty cycle.

The preferred embodiment frequency doubler in FIG. 3 doubles the frequency of the input signal, and keeps the 50% duty cycle without using large resistors and capacitors for delaying and low-pass filtering. Most importantly, the preferred embodiment frequency doubler generates very stable frequency and 50% duty cycle without using a feedback circuit. This allows for faster response time than conventional prior art circuits. The performance of the preferred embodiment frequency doubler only relies on capacitor and current matching that can be well controlled in circuit design.

The preferred embodiment frequency doubler in FIG. 3 requires 50% duty cycle for the input signal. However, in some applications, the input signal does not have 50% duty cycle. In this case, a new input signal is generated with a 50% duty cycle for the frequency doubler.

Figure 5:
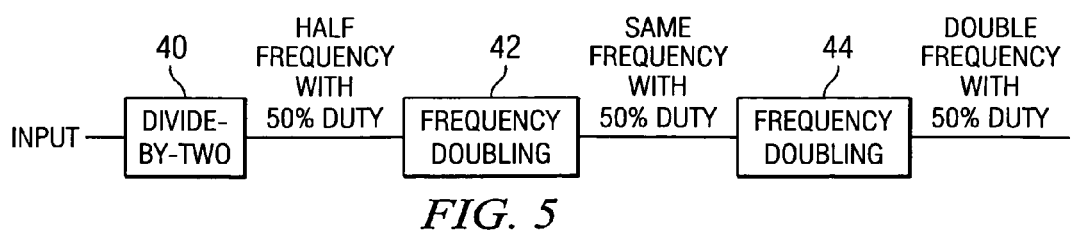
FIG. 5 is a complete frequency doubling circuit according to the present invention.

To solve the duty cycle requirement of the input signal for the preferred embodiment frequency doubler shown in FIG. 3, a divide-by-two circuit 40, usually implemented by a T-flip-flop circuit, is used to divide the input signal, as shown in FIG. 5. Since the input signal has stable frequency, the divided signal has 50% duty cycle, but the frequency is only half the frequency of the input signal, as shown in FIG. 5. After having the divided signal with a stable 50% duty cycle and a half frequency of the original input signal, two frequency doublers 42 and 44 are applied to obtain an output signal with a stable 50% duty cycle and a doubling frequency of the original input signal, as shown in FIG. 5. As indicated in FIG. 5, the frequency of the output of the first frequency doubler 42 will be the same as the original input frequency but with 50% duty cycle. At the output of the second frequency doubler 44, the frequency is double the input signal with 50% duty cycle.

The complete frequency doubling circuit is shown in FIG. 5. It consists of a divide-by-two 40 and two frequency doublers 42 and 44, where the two frequency doublers are of the type shown in FIG. 3. The divide-by-two circuit 40 (usually a simple T-f flip-flop circuit) guarantees an input signal with 50% duty cycle for the following frequency doubler. The divided signal is then doubled twice. As a result, the output signal of the circuit has a doubled frequency and 50% duty cycle. Four comparators, eight small capacitors, and some switches and transistors are required for each frequency doubler, as shown in FIG. 3.

The preferred embodiment circuit has many advantages over the prior art circuits. By dividing the input signal, the preferred embodiment circuit eliminates the requirement of 50% duty cycle on the input signal for frequency doubling or multiplying.

The 50% duty cycle of the output signal is guaranteed by the matching current sources and capacitors which can be well controlled in CMOS process. The preferred embodiment circuit can double the frequency of the input signal, and keep the 50% duty cycle without using large resistors and capacitors for delaying and low-pass filtering. Its performance is independent of the input frequency, power supply voltage, temperature, and process. Because of feed-forward structure instead of feedback structure, the new circuit responds almost instantaneously. Except for the first cycle, it outputs 50% duty cycle output signals.

The circuit can be modified to be a frequency multiplier by changing the value of capacitors Cb and Cd and getting different intersection of signals A and B. Then multiple Cbs are applied to get frequency multification.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

What is claimed is:

1. A frequency multiplier circuit having an input and an output comprising:
    an XOR gate;
    a first comparator coupled to a first input of the XOR gate;
    a second comparator coupled to a second input of the XOR gate;
    a first capacitor device coupled to a first input of the first comparator;
    a second capacitor device coupled to a second input of the first comparator;
    a third capacitor device coupled to a first input of the second comparator;
    a fourth capacitor device coupled to a second input of the second comparator.

2. The circuit of claim 1 wherein the first capacitor device comprises:
    a capacitor;
    a first switch coupled between the capacitor and the first input of the first comparator;
    a current source;
    a second switch coupled between the current source and the capacitor; and
    a third switch coupled in parallel with the capacitor.

3. The circuit of claim 2 wherein the first, second, and third switches are controlled by an input signal such that when the first and second switches are on, the third switch is off.

4. The circuit of claim 1 wherein the second capacitor device comprises:
    a capacitor coupled to the second input of the first comparator;
    a current source;

a first switch coupled between the current source and the capacitor; and
a second switch coupled in parallel with the capacitor.

5. The circuit of claim 4 wherein the first and second switches are controlled by an input signal such that when the first switch is off, the second switch is on.

6. The circuit of claim 1 wherein the third capacitor device comprises:
a capacitor;
a first switch coupled between the capacitor and the first input of the second comparator;
a current source;
a second switch coupled between the current source and the capacitor; and
a third switch coupled in parallel with the capacitor.

7. The circuit of claim 6 wherein the first, second, and third switches are controlled by an input signal such that when the first and second switches are off, the third switch is on.

8. The circuit of claim 1 wherein the fourth capacitor device comprises:
a capacitor coupled to the second input of the second comparator;
a current source;
a first switch coupled between the current source and the capacitor; and
a second switch coupled in parallel with the capacitor.

9. The circuit of claim 8 wherein the first and second switches are controlled by an input signal such that when the first switch is on, the second switch is off.

10. A frequency multiplier circuit having an input and an output comprising:
an XOR gate;
a first comparator coupled to a first input of the XOR gate;
a second comparator coupled to a second input of the XOR gate;
a first capacitor switching device coupled to the first comparator, and controlled by an input signal; and
a second capacitor switching device coupled to the second comparator, and controlled by the input signal, wherein a frequency of an output signal of the XOR gate is X times a frequency of the input signal of the multiplier circuit,
wherein the first capacitor switching device comprises:
a first capacitor;
a first switch coupled between the first capacitor and a first input of the first comparator;
a first current source;
a second switch coupled between the first current source and the first capacitor;
a third switch coupled in parallel with the first capacitor;
a second capacitor coupled to a second input of the first comparator;
a second current source;
a fourth switch coupled between the second current source and the second capacitor; and
a fifth switch coupled in parallel with the second capacitor.

11. The circuit of claim 10 wherein the first, second, third, fourth, and fifth switches are controlled by an input signal such that when the first, second, and fifth switches are on, the third and fourth switches are off.

12. A frequency multiplier circuit having an input and an output comprising:
an XOR gate;
a first comparator coupled to a first input of the XOR gate;
a second comparator coupled to a second input of the XOR gate;
a first capacitor switching device coupled to the first comparator, and controlled by an input signal; and
a second capacitor switching device coupled to the second comparator, and controlled by the input signal, wherein a frequency of an output signal of the XOR gate is X times a frequency of the input signal of the multiplier circuit,
wherein the second capacitor switching device comprises:
a first capacitor;
a first switch coupled between the first capacitor and a first input of the second comparator;
a first current source;
a second switch coupled between the first current source and the first capacitor;
a third switch coupled in parallel with the first capacitor;
a second capacitor coupled to a second input of the second comparator;
a second current source;
a fourth switch coupled between the second current source and the second capacitor; and
a fifth switch coupled in parallel with the second capacitor.

13. The circuit of claim 12 wherein the first, second, third, fourth, and fifth switches are controlled by an input signal such that when the first, second, and fifth switches are off, the third and fourth switches are on.

* * * * *